(12) United States Patent
Lee et al.

(10) Patent No.: US 9,626,887 B2
(45) Date of Patent: Apr. 18, 2017

(54) IMAGE DISPLAY DEVICE AND METHOD AND APPARATUS FOR IMPLEMENTING AUGMENTED REALITY USING UNIDIRECTIONAL BEAM

(71) Applicant: Samsung Electronics Co., Ltd., Suwon-Si, Gyeonggi-Do (KR)

(72) Inventors: Jae-soong Lee, Suwon-si (KR); Jin-eun Kim, Suwon-si (KR); Young-geun Roh, Seoul (KR); Yeon-sang Park, Seoul (KR); Hwan-soo Suh, Gunpo-si (KR); Sung-woo Hwang, Seoul (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 312 days.

(21) Appl. No.: 14/152,072

(22) Filed: Jan. 10, 2014

(65) Prior Publication Data

US 2014/0320547 A1    Oct. 30, 2014

(30) Foreign Application Priority Data

Apr. 26, 2013   (KR) ........................ 10-2013-0046933

(51) Int. Cl.
*G09G 5/10*    (2006.01)
*G09G 3/00*    (2006.01)
*G02B 27/22*   (2006.01)
*G02B 27/01*   (2006.01)
*H01L 33/10*   (2010.01)

(52) U.S. Cl.
CPC ......... *G09G 3/001* (2013.01); *G02B 27/0101* (2013.01); *G02B 27/017* (2013.01); *G02B 27/225* (2013.01); *G02B 2027/0178* (2013.01); *G09G 2300/046* (2013.01); *H01L 33/105* (2013.01)

(58) Field of Classification Search
CPC   G02B 27/017; G02B 27/0101; G02B 27/225; G02B 2027/0178; G09G 3/001; G09G 2300/046; H01L 33/105
See application file for complete search history.

(56) References Cited

U.S. PATENT DOCUMENTS 5,467,205 A * 11/1995 Kuba ................... G02B 27/017
                                                          348/E13.04
2002/0024743 A1 * 2/2002 Endo .................... G02B 5/3016
                                                          359/643
2005/0200589 A1 * 9/2005 Takatori .............. G09G 3/3648
                                                          345/98

(Continued)

FOREIGN PATENT DOCUMENTS

KR       20120041039 A      4/2012
KR       20120120209 A     11/2012

*Primary Examiner* — Andrew Sasinowski
*Assistant Examiner* — Brent D Castiaux
(74) *Attorney, Agent, or Firm* — Harness, Dickey & Pierce, P.L.C.

(57) ABSTRACT

An image display device includes a display panel unit having a plurality of optical elements configured to generate and emit unidirectional lights in an array and a control unit configured to control the plurality of optical elements according to image information. The image display device is located very close to the eyes of a user and displays an additional information image added to a real image, thereby implementing augmented reality.

18 Claims, 8 Drawing Sheets

(56) References Cited

U.S. PATENT DOCUMENTS

| | | |
|---|---|---|
| 2009/0189974 A1 | 7/2009 | Deering |
| 2010/0149073 A1* | 6/2010 | Chaum .............. G02B 27/0093 345/8 |
| 2012/0026071 A1 | 2/2012 | Hamdani et al. |
| 2012/0050144 A1* | 3/2012 | Morlock ............... G06T 19/006 345/8 |
| 2012/0105310 A1 | 5/2012 | Sverdrup et al. |
| 2012/0200667 A1 | 8/2012 | Gay et al. |
| 2013/0300636 A1* | 11/2013 | Cunningham .......... G10L 13/02 345/8 |

* cited by examiner

IMAGE DISPLAY DEVICE AND METHOD AND APPARATUS FOR IMPLEMENTING AUGMENTED REALITY USING UNIDIRECTIONAL BEAM

CROSS-REFERENCE TO RELATED APPLICATIONS

This application claims the benefit of Korean Patent Application No. 10-2013-0046933, filed on Apr. 26, 2013, in the Korean Intellectual Property Office, the entire contents of which are incorporated herein in its entirety by reference.

BACKGROUND

1. Field

The present disclosure relates to image display devices and/or methods and apparatuses for implementing augmented reality using a unidirectional beam.

2. Description of the Related Art

Augmented reality is a kind of virtual reality service showing one image by mixing a real world image as seen by a user with a virtual world image having additional information. Virtual reality newly creates a space as a game but augmented reality may provide additional information by mixing virtual objects with a base of real images. Due to this, and unlike virtual reality, augmented reality may be applied in various ways to reality. To implement the augmented reality, key technologies regarding a camera, a sensor, computer graphics, registration technology, display devices, etc., are used. Such technologies recognize peripheral information and eyes, postures, and movements of a user, generate an image having additional information, and transfer the image mixed with a real image to the user.

To view such augmented reality images, the user may have difficulty wearing a large headset or wearing glasses.

SUMMARY

Provided are image display devices and/or methods and apparatuses for implementing augmented reality using a unidirectional beam.

Additional aspects will be set forth in part in the description which follows and, in part, will be apparent from the description, or may be learned by practice of example embodiments.

According to an example embodiment, an image display device includes a display panel unit including a plurality of optical elements configured to generate and emit unidirectional lights in an array and a control unit configured to control the plurality of optical elements, respectively, according to image information.

The plurality of optical elements each may include a light emitting structure layer configured to generate light and reflectors disposed on a top and a bottom of the light emitting structure layer, respectively, to unidirectionally emit the light generated by the light emitting structure layer.

The optical elements each may include one of a laser and a resonant cavity light emitting diode (RCLED).

The image display device may further include a user wearable lens, and the display panel unit may be embedded in the lens or is disposed on a surface of the lens.

In the display panel unit, the plurality of optical elements generating lights having different wavelengths may form a unit pixel, and the image display device is configured to form an image by using a combination of spaces of lights formed by a plurality of unit pixels, respectively.

Also, the plurality of optical elements may form a unit pixel, and the image display device is configured to sequentially control an emitting direction of light formed by the unit pixel and form an image by the sequential combination of lights heading for different directions.

The image display device may further include a variable optical unit whose optical characteristics vary with an external signal, sequentially change the emitting direction of the light formed by the unit pixel.

The display panel unit may be embedded in the lens, and the variable optical unit may be embedded in the lens or is disposed on the surface of the lens.

The image display device may further include a driving unit configured to drive positions of the plurality of optical elements forming the unit pixel.

The image display device may further include a direction adjustment unit configured to control a direction of the lights generated and emitted by the plurality of optical elements.

The display panel unit may be embedded in the lens, and the direction adjustment unit may be embedded in the lens or is disposed on a surface of the lens.

The display panel unit may be disposed in a location in the lens, the location facing the pupil of the eye of the user.

The lens may be formed in a pair thereof corresponding to both eyes of the user, the display panel unit may include a first display panel unit and a second display panel unit corresponding to the both eyes, respectively, and the control unit may include a first control unit configured to control the first display panel unit according to left eye image information and a second control unit configured to control the second display panel unit according to right eye image information.

The control unit is configured to control the display panel unit according to wirelessly received image information.

The image display device may further include a light amount control unit whose light transmittance controls the amount of light from the outside.

The light amount control unit may include a liquid crystal.

The image display device may further include an energy storage unit configured to store energy to be supplied to the plurality of optical elements, respectively, to generate lights and a reception circuit unit configured to receive image information from the outside. The energy storage unit and the reception circuit unit are disposed in locations of the lens, out of a location facing the pupil of the eye of the user.

According to another example embodiment, a method of implementing one of augmented reality and virtual reality includes displaying an additional image bearing additional information on an object in reality by directly emitting the additional image, the additional image formed by using unidirectional beams with no diffusion to the retina of the eye of the user.

A process of forming an image by using the unidirectional beams with no diffusion may be performed in a location within a distance of 5 cm or less from the eye of the user.

According to another example embodiment, an augmented reality implementing apparatus includes a real image display unit configured to display one of at least one object and an image with respect thereto, an additional image information generation unit configured to convert information on the object into image information, and an image display device configured to receive the image information from the additional image information generation unit and form an image. The image display device includes a display panel unit having a plurality of optical elements configured to generate and emit unidirectional lights, and a control unit configured to control the plurality of optical elements, respectively, according to image information.

The image display device may be disposed in a location within a distance of 5 cm or less from the eye of the user.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Reference will now be made in detail to embodiments, examples of which are illustrated in the accompanying drawings, wherein like reference numerals refer to like elements throughout. In the drawings, sizes and thicknesses of layers and regions are exaggerated for clarity and convenience. In this regard, the present embodiments may have different forms and should not be construed as being limited to the descriptions set forth herein. Accordingly, the embodiments are merely described below, by referring to the figures, to explain aspects of the present description.

It will be understood that, although the terms first, second, third etc. may be used herein to describe various elements, these elements should not be limited by these terms. These terms are used to distinguish one element from another. Thus, a first element discussed below could be termed a second element without departing from the teachings of example embodiments. As used herein, the term "and/or" includes any and all combinations of one or more of the associated listed items.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
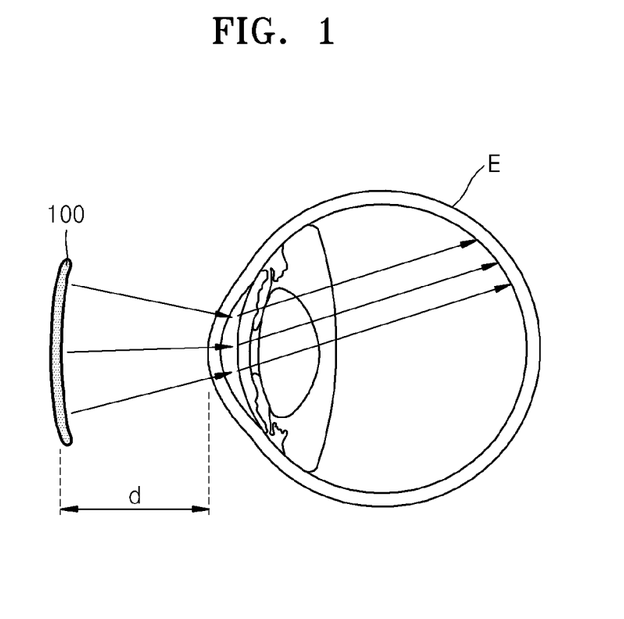
FIG. 1 is a conceptual view illustrating that an image display device may form an image recognized by a human eye at a very short distance from the eye, according to an example embodiment.

FIG. 1 is a view illustrating a method in which an image display device 100 may form an image recognized by human eye at a very short distance from the eye, according to an example embodiment.

From an optical point of view, the eye may form definite images of an object at an infinitely distant place and of an object at a place with a distance of about 10 cm. Since it is difficult to form an image of an object located closer than this, an auxiliary device is used. However, even if using an optical element such as a lens, it is difficult to provide a near point of 1 cm or less and an image becomes indefinite due to diffraction and an aberration. That is, an image formed at a point very close to the eye of a user is difficult to be recognized by the eye by using a general optical system focusing a pencil of light rays.

The image display device 100 generates a unidirectional light with little diffusion, forms an image by using the unidirectional light, and directly emits the image to the retina of the user to allow the user to recognize the image formed on the retina.

In the case of an image formed by using diffused light, at a close distance d that is not recognized by the eye of the user by controlling the eye lens, for example, at a distance of about 5 cm or less, the image display device 100 may form an image that may be recognized by the eye of the human.

Hereinafter, various examples of the image display device will be described.

Figure 2:
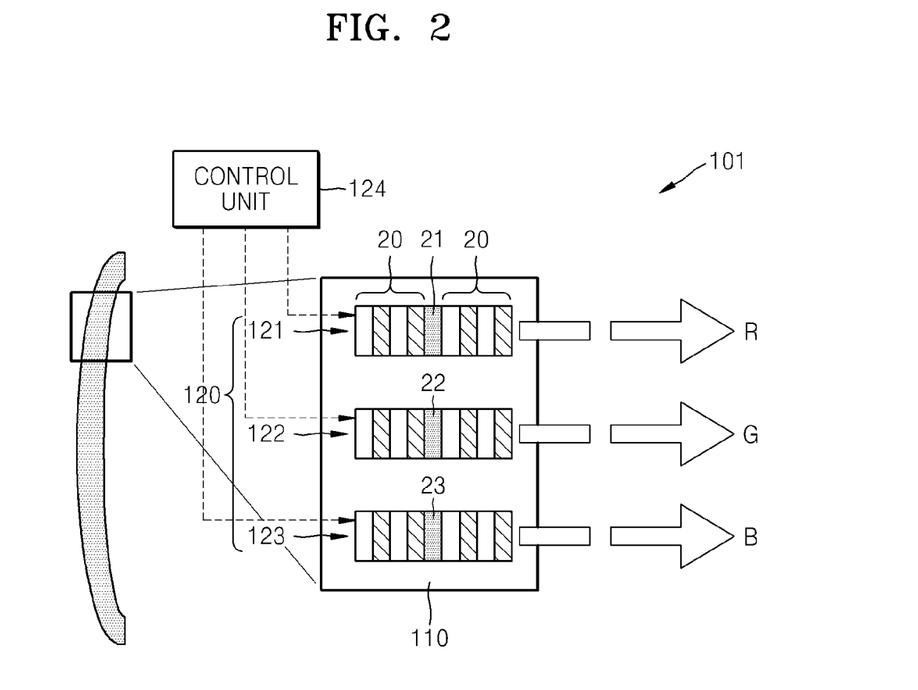
FIG. 2 is a schematic configuration view illustrating an image display device according to an example embodiment.

FIG. 2 is a schematic configuration view illustrating an image display device 101 according to an example embodiment.

The image display device 101 includes a display panel unit 120 on which a plurality of optical elements 121, 122, and 123 generating and emitting unidirectional lights are arrayed and a control unit 124 controlling the plurality of optical elements 121, 122, and 123 to be turned on/off, respectively.

In the display panel unit 120, the plurality of optical elements 121, 122, and 123 generating light having different wavelengths, respectively, form a unit pixel and an image may be formed of a combination of lights formed by a plurality of unit pixels, respectively. In FIG. 2, for convenience, there is shown only one unit pixel.

The image display device 101 further includes a lens 110 worn over the eye of the user as a contact lens or eyeglasses, and the display panel unit 120 may be embedded inside the lens 110 or may be disposed on a surface of the lens 110.

Hereinafter, there will be described a case in which the image display device 101 includes the lens 110 and the display panel unit 120 is embedded in the lens 110. However, the lens 110 is not an essential element of the image display device 101 and may be embodied in a different form. Also, the display panel unit 120 may be disposed on the surface of the lens 110.

The optical elements 121, 122 and 123 generate and emit unidirectional beams, respectively. Hereinafter, in describing lights emitted from the optical elements 121, 122, and 123, expressions such as beams with no diffusion, straight beams, and unidirectional beams are used while being mixed with one another, all of which have similar meanings. In a description such as "with no diffusion", "going straight", and "unidirectional" is not limited to being perfect at 100% but means the degree of being clearly recognized to the retina of the user with no focus adjustment of the eye lens being necessary. The optical elements 121, 122, and 123 include light-emitting structure layers 21, 22, and 23 generating lights and reflectors 20 disposed on top and bottom of the light emitting structure layers 21, 22, and 23, respectively, to form a mode of emitting the lights generated by the light emitting structure layers 21, 22, and 23 to be unidirectionally emitted.

The light emitting structure layers 21, 22, and 23 may be formed of semiconductor layers generating lights by coupling electrons and positive holes and may be configured to be in a plurality thereof. For example, the light emitting structure layers 21, 22, and 23 may include n-type semiconductors and p-type semiconductors for injecting electrons and positive holes, respectively, and active layers where the injected electrons and positive holes are combined with one another. Depending on materials forming the light emitting structure layers 21, 22, and 23, wavelength bands of emitted lights thereof may be controlled. For example, the materials of the light emitting structure layers 21, 22, and 23 may be determined to form lights of red R, green G, and blue B, respectively.

The reflectors 20 may be distributed Bragg reflectors (DBRs) where a plurality of dielectric material layers having different dielectric constants are alternately deposited with a certain thickness. The number of layers forming the reflectors 20 is not limited to that shown in FIG. 2 but may be appropriately determined by considering reflecting efficiency.

For example, as the optical elements 121, 122, and 123, laser or resonant cavity light emitting diodes (RCLEDs) may be used.

Figure 3:
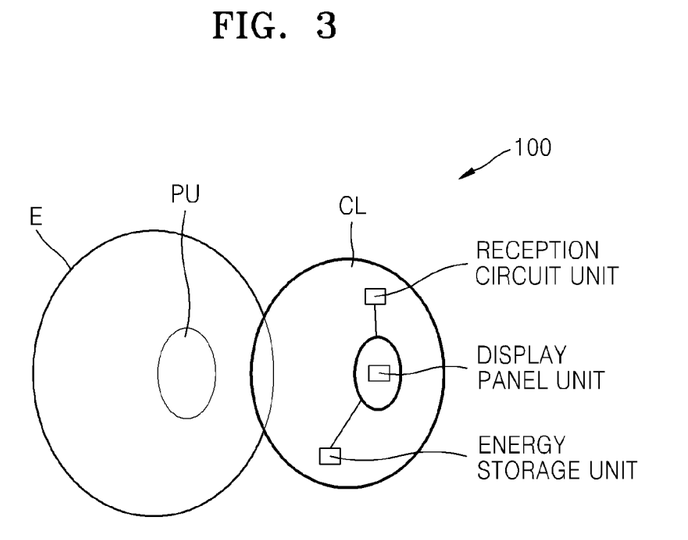
FIG. 3 is a view illustrating an example configuration in which more detailed elements of the image display device are arranged when the image display device is configured to employ a contact lens.

FIG. 3 is a view illustrating an example configuration in which more detailed elements of the image display device 100 are arranged when the image display device 100 is configured to employ a contact lens CL.

In the contact lens CL, a display panel unit may be disposed at a location facing a pupil PU of an eye E of the user. The display panel unit, in consideration of a diameter of the pupil PU of about 5 mm, includes optical elements having sizes and numbers allowing an image having proper resolution in this space. For example, when an image having a resolution of 1024×768 is to be provided by using an optical element having a size of about 1 um, the display panel unit occupies about 20% of a surface area of the pupil PU. An amount of light arriving at the retina may be reduced due to an area occupied by the display panel unit, and a way of reducing the area occupied by the display panel unit will be described below.

Also, the image display device 100 may further include an energy storage unit storing energy to be supplied for generating lights to a plurality of optical elements forming the display panel unit and a reception circuit unit for receiving image information from the outside. The energy storage unit may be provided together with an energy collection unit and may provide electric energy for recombination of electrons and positive holes to a light emitting structure layer of the optical element. Also, the reception circuit unit may function as a control unit wirelessly receiving the image information from the outside and controlling the respective optical elements forming the display panel unit to be turned on/off according to the image information. The energy storage unit and the reception circuit unit, as shown in FIG. 3, may be disposed at a place of the contact lens CL other than the location facing the pupil PU of the eye E of the user.

Although the contact lens CL is shown in the drawing, a similar arrangement may be applied to eyeglasses.

Figure 4:
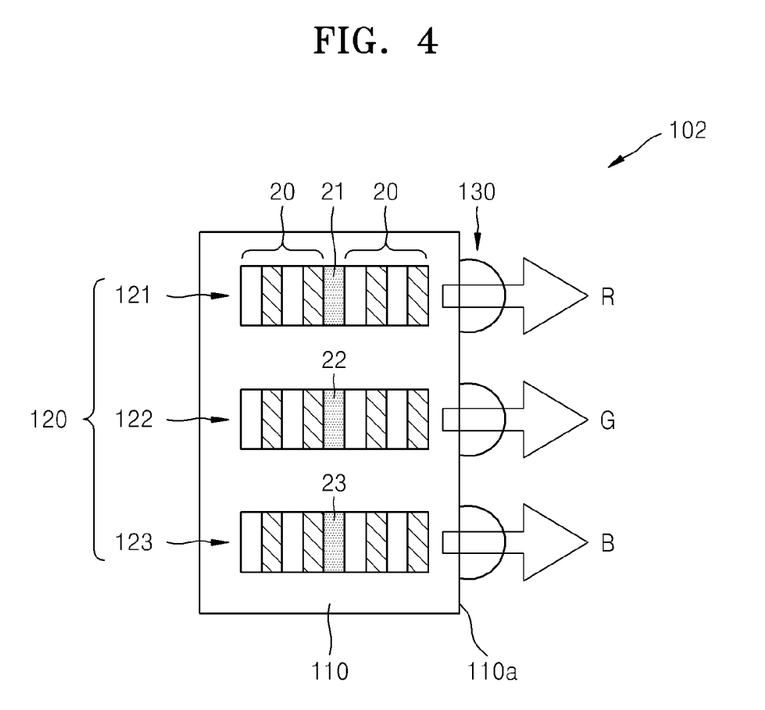
FIG. 4 is a schematic configuration view illustrating an image display device according to another example embodiment.

FIG. 4 is a schematic configuration view illustrating an image display device 102 according to another example embodiment.

The image display device 102 is different from the image display device 101 of FIG. 2 in terms of further including a direction adjustment unit 130 for adjusting directions of lights generated and emitted by the plurality of optical elements 121, 122, and 123.

The direction adjustment unit 130 is provided to supplement the straightness of the lights generated and emitted by the plurality of optical elements 121, 122, and 123 with no diffusion and, as shown in the drawing), may have the form of a micro lens array. The direction adjustment unit 130 having the form of the micro lens array may be disposed on a lens surface 110a to allow lenses forming the micro lens array to correspond to the plurality of optical elements 121, 122, and 123, respectively.

Figure 5:
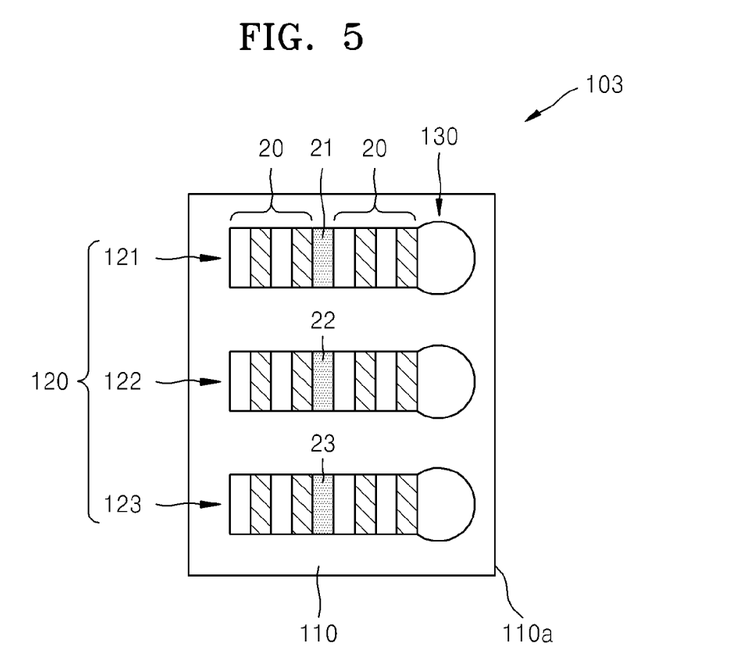
FIG. 5 is a schematic configuration view illustrating an image display device according to another example embodiment.

FIG. 5 is a schematic configuration view illustrating an image display device 103 according to yet another example embodiment.

The image display device 103 is different from the image display device 102 of FIG. 4 in terms of the arrangement of the direction adjustment unit 130.

The direction adjustment unit 130 having the form of the micro lens array may be embedded together with the display panel unit 120 in the lens 110, and lenses forming a micro lens array may be disposed on the plurality of optical elements 121, 122, and 123, respectively.

Figure 6:
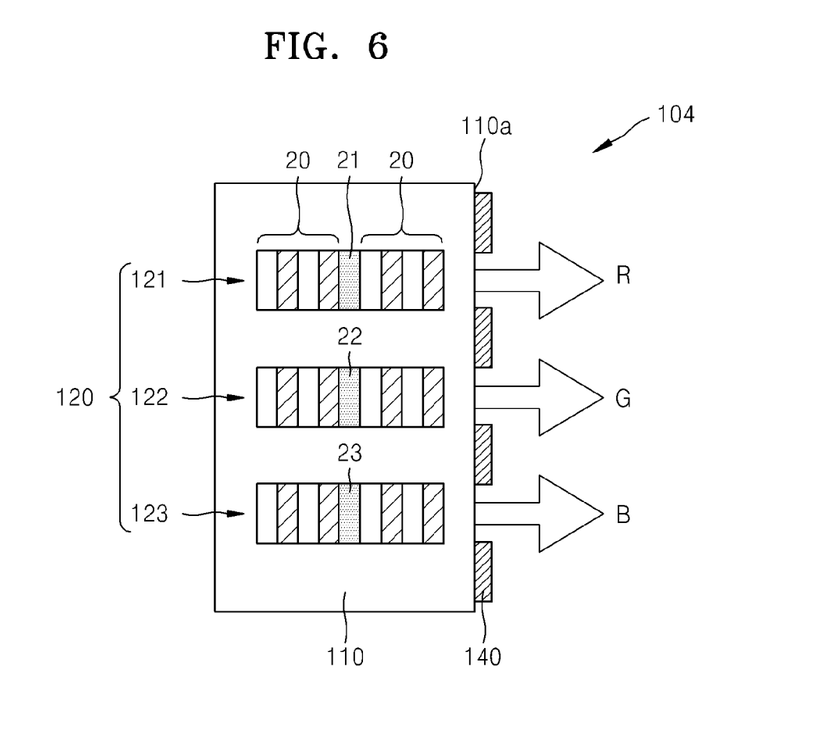
FIG. 6 is a schematic configuration view illustrating an image display device according to another example embodiment.

FIG. 6 is a schematic configuration view illustrating an image display device 104 according to another example embodiment.

The image display device 104 includes a direction adjustment unit 140 having the form of a meta structure to function similarly to the direction adjustment unit 130 shown in FIGS. 4 and 5.

The meta structure is a structure forming a pattern having a size of subwavelength and uses a meta material, which has been known to exhibit new phenomena that do not exist in nature, such as subwavelength focusing, negative refraction, extraordinary transmission, and invisibility cloaking. With respect to electromagnetic waves such as lights, photonic crystals and surface plasmonic structures may be examples of the meta structure. Using the meta structure, the straightness of the lights emitted from the plurality of optical elements 121, 122, and 123, respectively, may be supplemented. The direction adjustment unit 140 having the form of the meta structure, as shown in the drawing, may be disposed on the lens surface 110a.

Figure 7:
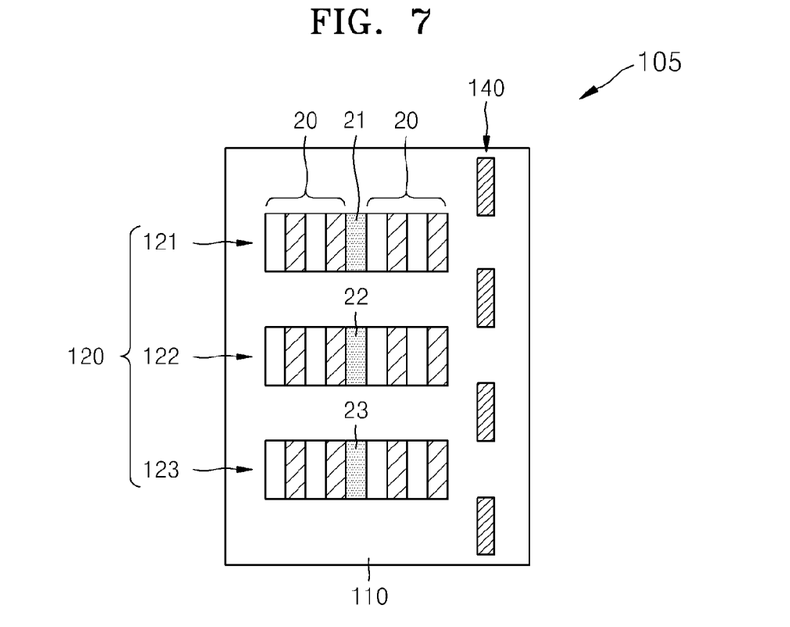
FIG. 7 is a schematic configuration view illustrating an image display device according to another example embodiment.

FIG. 7 is a schematic configuration view illustrating an image display device 105 according to another example embodiment.

The image display device 105 includes the direction adjustment unit 140 using the meta structure, and the direction adjustment unit 140 is embedded in the lens 110 together with the display panel unit 120.

As described above, as shown in FIGS. 4 to 7, the micro lens arrays and the meta structures have been shown as the direction adjustment units 130 and 140. However, in addition thereto, various elements capable of controlling light may be used.

Figure 8:
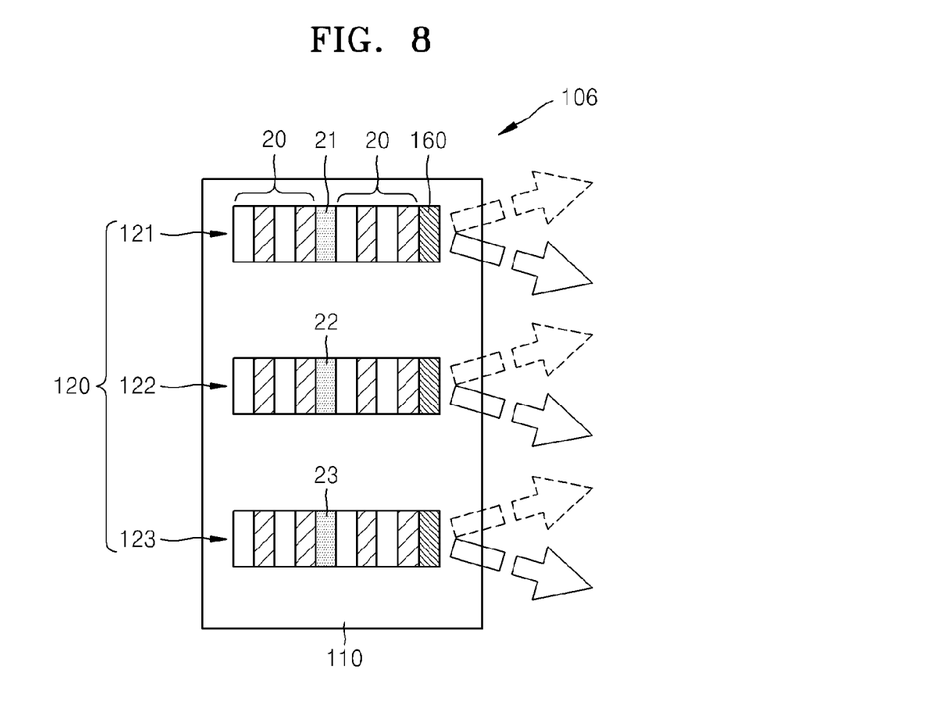
FIG. 8 is a schematic configuration view illustrating an image display device according to another example embodiment.

FIG. 8 is a schematic configuration view illustrating an image display device 106 according to another example embodiment.

The image display device 106 has a structure in which emitting directions of lights generated and emitted from the plurality of optical elements 121, 122, and 123 forming the display panel unit 120 are time-sequentially controlled and an image is formed by using a time-sequential combination of the lights heading in different directions. That is, the plurality of optical elements 121, elements 121, 122, and 123 forms a combination of lights corresponding to one pixel at a time point t1 and forms a combination of lights corresponding to another pixel at a time point t2. Also, directions of the lights emitted from the plurality of optical elements 121, 122, and 123 are controlled to allow the lights formed at the time points t1 and t2, respectively, to scan the retina. Accordingly, the image may be recognized by using the sequential combinations of the lights scanning the retina.

The image display device 106 is provided to reduce the number of unit pixels forming the display panel unit 120 in which the plurality of optical elements 121, 122, and 123 generating lights having different wavelengths from one another form a unit pixel and one or more unit pixels are arranged to form the display panel unit 120.

To form the display panel unit 120 by arranging a plurality of unit pixels and to provide a resolution of about 1024×768, about 20% of the surface area of the pupil is covered, which has been described above with reference to FIG. 2. On the other hand, when the emitting directions of the lights formed by the unit pixels are time-sequentially controlled and the retina is scanned by the lights emitted from the unit pixels, the number of the unit pixels may be reduced to one, at minimum. Considering a scanning speed allowing the time-sequentially scanning lights to be recognized as one image, the number of the unit pixels may be properly determined and the number of the necessary unit pixels may be notably reduced.

The image display device 106 time-sequentially changes the emitting directions of the lights formed by the plurality of optical elements 121, 122, and 123 and may further include a variable optical unit 160 whose optical properties vary with external signals.

The variable optical unit 160 may be formed by using a material whose optical characteristics, such as a refractive index, vary by applying an external signal, for example, heat or an electromagnetic field or may be formed of a fluid lens causing a change of a lens surface shape according to a flow of a fluid caused by a pressure or an electromagnetic field. As the variable optical unit 160, a meta structure such as photonic crystals and a surface plasmonic structure may be used, in which the material whose optical characteristics such as a refractive index vary by applying heat or an electromagnetic field may be used together therewith.

In the image display device 106, the display panel unit 120 and the variable optical unit 160 are embedded in the lens 110.

Figure 9:
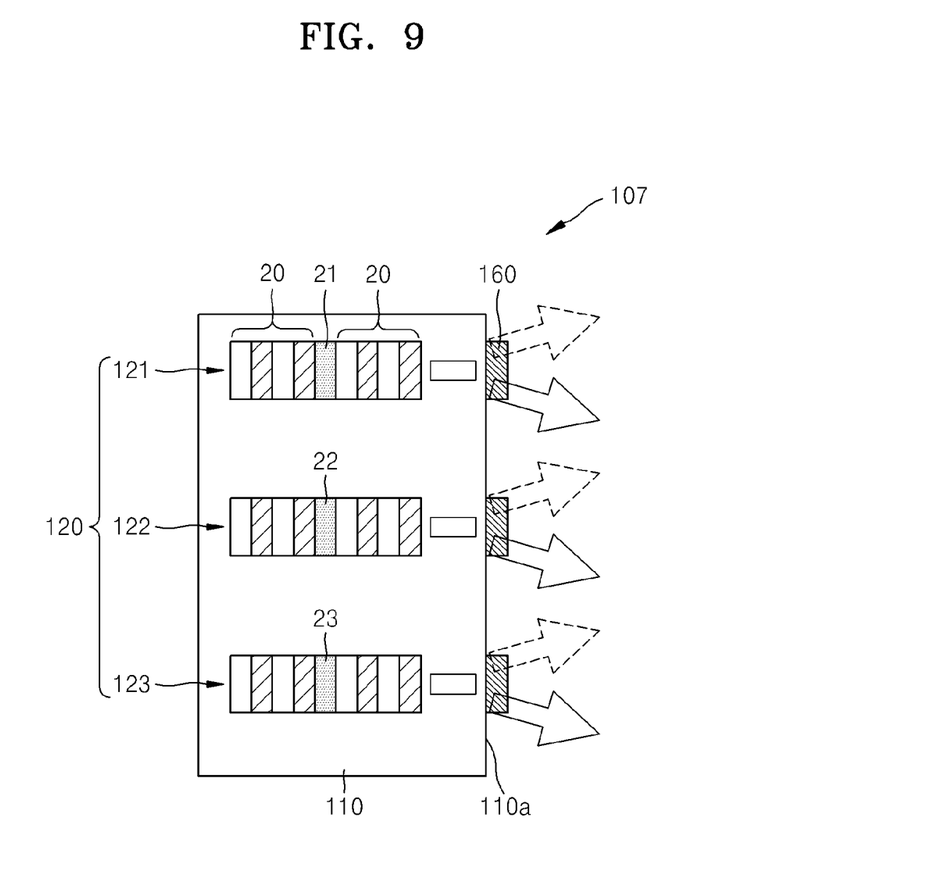
FIG. 9 is a schematic configuration view illustrating an image display device according to another example embodiment.

FIG. 9 is a schematic configuration view illustrating an image display device 107 according to another example embodiment.

In the image display device 107, the display panel unit 120 is embedded in the lens 110 and the variable optical unit 160 is formed on a lens surface 110a.

Figure 10:
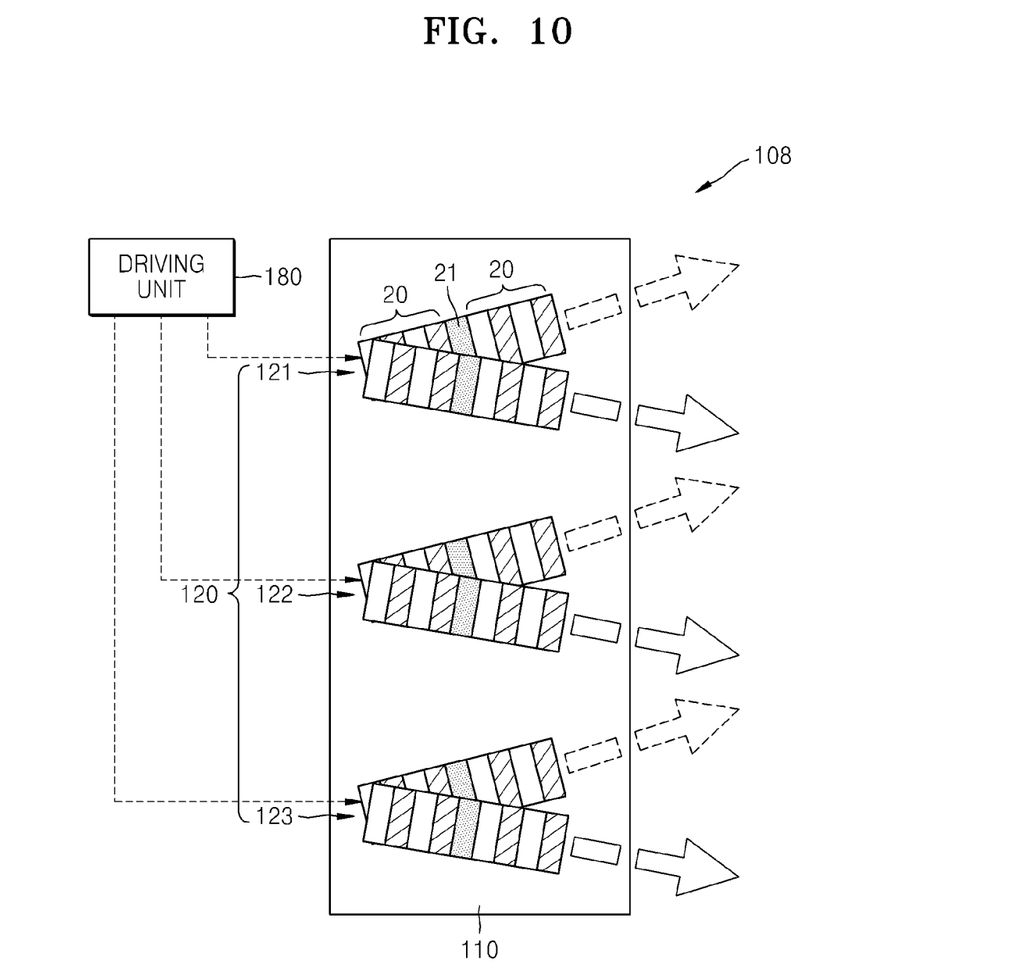
FIG. 10 is a schematic configuration view illustrating an image display device according to another example embodiment.

FIG. 10 is a schematic configuration view illustrating an image display device 108 according to another example embodiment.

The image display device 108 has a configuration in which locations of the plurality of optical elements 121, 122, and 123 are driven to allow emitting directions of lights to be time-sequentially changed. The image display device 108 further includes a driving unit 180 for driving the plurality of optical elements 121, 122, and 123. For this, micro electromechanical system (MEMS) technology may be used.

Figure 11:
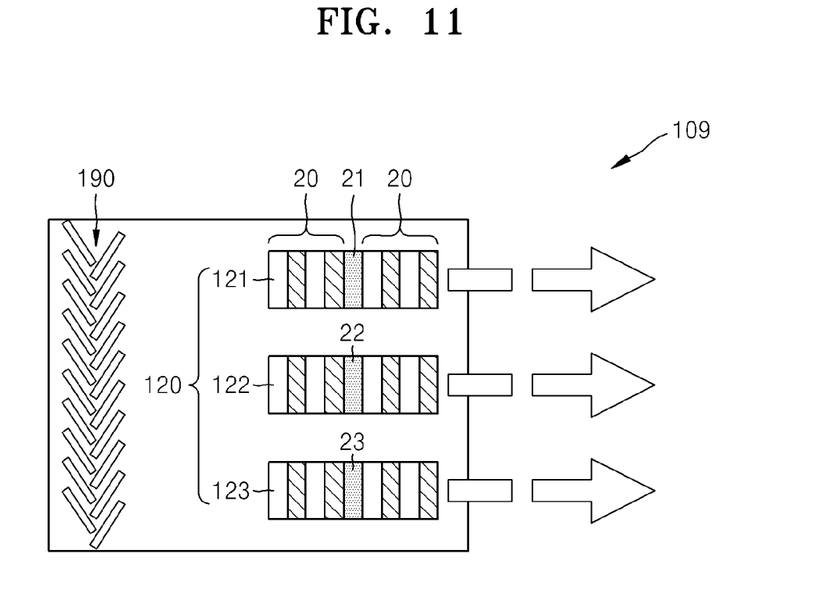
FIG. 11 is a schematic configuration view illustrating an image display device according to another example embodiment.

FIG. 11 is a schematic configuration view illustrating an image display device 109 according to another example embodiment.

The image display device 109 further includes a light amount control unit 190 whose light transmittance is controlled, to control the amount of light from the outside. The light amount control unit 190 may be formed using a liquid crystal whose light transmittance is controlled according to an electric signal. Since the amount of incident light may be controlled considering external luminance by using the light amount control unit 190, the visibility of an image formed by the image display device 109 may be increased.

Figure 12:
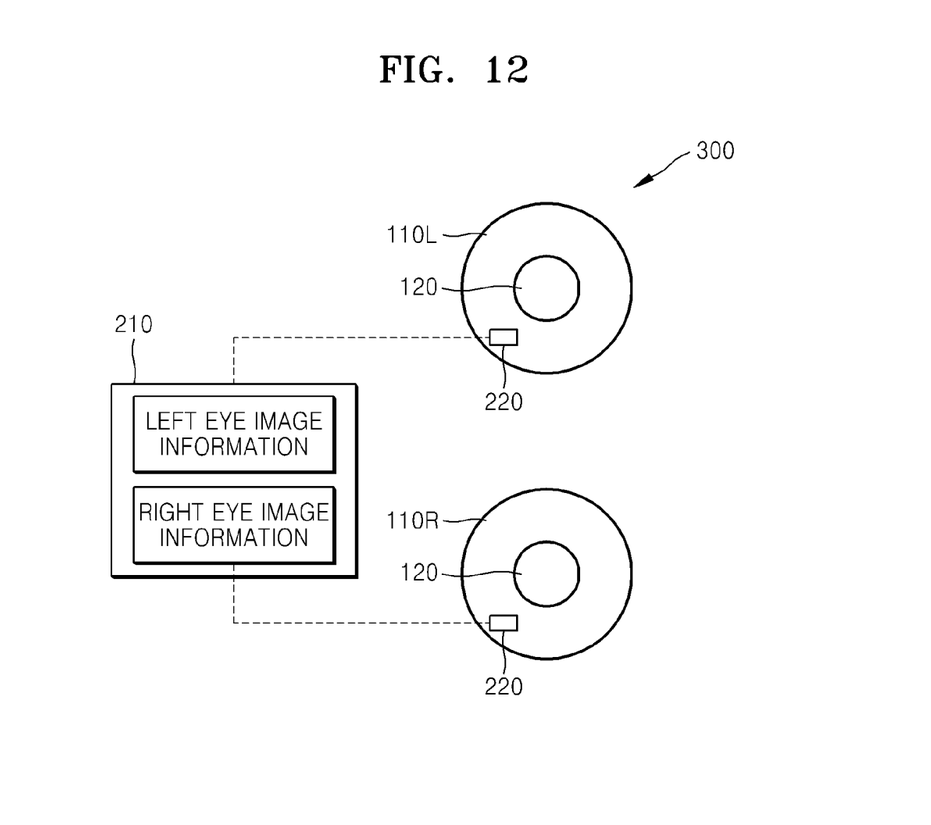
FIG. 12 is a schematic configuration view illustrating an image display device according to another example embodiment.

FIG. 12 is a schematic configuration view illustrating an image display device 300 according to another example embodiment.

The image display device 300 provides an example configuration capable of forming a three-dimensional (3D) image. The image display device 300 includes a pair of lenses corresponding to both eyes of the user, that is, a left eye lens 110L and a right eye lens 110R, and the display panel units 120 and control units 220 are located on the left eye lens 110L and the right eye lens 110R, respectively. The provided control units 220 respectively control the display panel unit 120 on the left eye lens 110L according to left eye image information and control the display panel unit 120 on the right eye lens 110R according to right eye image information.

The left eye image information and the right eye image information may be prepared by an image information generation unit 210, and information of the image information generation unit 210 may be wirelessly transmitted to the control unit 220. The control unit 220 may include a reception circuit unit for wirelessly receiving the information of the image information generation unit 210.

The display panel unit 120 includes, as shown in FIGS. 2 to 10, the plurality of optical elements 121, 122, and 123. Also, the image display device 300 may also further include the direction control units 130 and 140, the variable optical unit 160, and/or the light amount control unit 190, described with reference to FIGS. 2 to 10, in addition to the left eye lens 110L and the right eye lens 110R.

Figure 13:
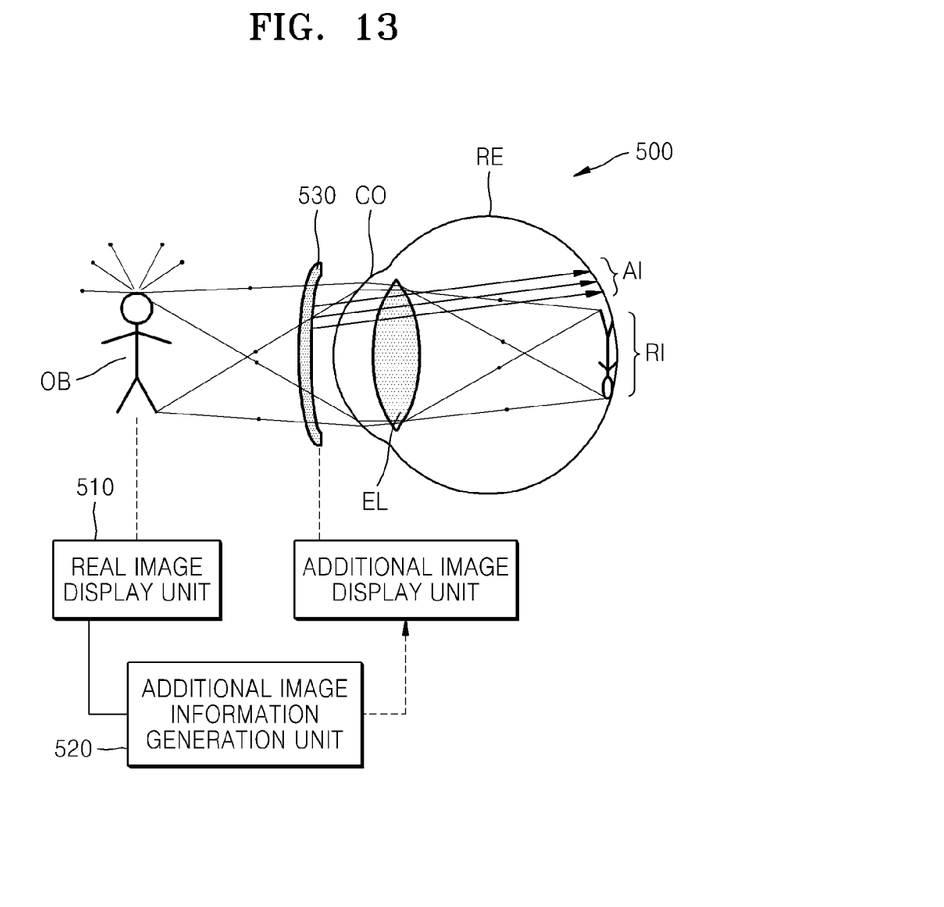
FIG. 13 is a schematic configuration view illustrating an augmented reality implementing apparatus according to an example embodiment.

FIG. 13 is a schematic configuration view illustrating an augmented reality implementing apparatus 500 according to an example embodiment.

The augmented reality implementing apparatus 500 is an apparatus for implementing augmented reality or virtual reality. Hereinafter, although the augmented reality will be described for convenience, the virtual reality may be considered as being included therein.

The augmented reality implementing apparatus 500 uses, as a method of implementing the augmented reality, a method of directly emitting an image formed of straight beams with no diffusion to the retina of the eye of the user to display an additional image including additional information about an object included in reality or an image with respect to the reality. A process of forming an image by using straight beams with no diffusion may be performed at a location within a distance of about 5 cm or less from the eye of the user, and one of the image display devices of the described embodiments may be used for the process.

In implementing the augmented reality or the virtual reality, the augmented reality implementing apparatus 500 uses an optical principle in which an image formed at a near point within a certain distance is not recognized by the human eye and also human eyes cannot focus on two objects at different distances at the same time.

The augmented reality shows reality seen by human eyes or an image with respect to the reality together with an image of a virtual world having additional information. Since human eyes cannot focus on two objects at different distances at the same time, when the user looks at a real image, a virtual image having a focal length different from the real image is not well recognized. Accordingly, in the present embodiment, a way of using a general optical system focusing a pencil of light rays is not used but the method of directly emitting the image formed of straight beams with no diffusion to the retina is used.

The augmented reality implementing apparatus 500 includes a real image display unit 510 displaying at least one object OB or an image thereof, an additional image information generation unit 520 converting information on the object OB into image information, and an additional image display unit 530 receiving the image information from the additional image information generation unit 520 and forming an image by using straight beams.

The real image display unit 510 may be a real world itself or may be a display apparatus displaying a moving image of the real world.

The additional image information generation unit 520 converts the information about the object OB included in the real image display unit 510 into the image information. The object OB recognized by the user according to the movement of the user in the real world which the user is looking at or the object OB recognized by the user according to a flow of moving images are being continuously changed, and the additional image information generation unit 520 forms the image information on the object OB recognized by the user to be synchronized thereto. The image information from the additional image information generation unit 520 may be wirelessly transmitted to the additional image display unit 530.

The additional image display unit 530 forms an additional image by using the straight beams with no diffusion according to the image information from the additional image information generation unit 520. As the additional image display unit 530, one of the image display devices 101 to 109 described above or a combination thereof may be used. The image display device may be disposed within a distance of about 5 cm or less from the eyes of the user and may be provided as contact lenses or eyeglasses.

Some of beams diffused in all directions from the object OB are incident to the eyes of the user, are refracted at a cornea CO, are focused by an eye lens EL, and form a real image RI on a retina RE.

An additional image AI with respect to the object OB is formed by using straight beams with no diffusion, and the beams are directly emitted to the retina RE to form the additional image.

Since the eyes of the user perform a focusing operation of the eye lens EL only to recognize the real image RI but not to recognize the additional image AI, the additional image AI may be recognized together with the real image RI without interference in recognizing the real image RI.

As described above, according to the one or more example embodiments, the display devices may form images by using unidirectional beams with no diffusion and may directly emit the images to the retina of the user. Accordingly, although the display devices are located very close to the eyes of the user, the user may recognize the images from the display devices and the display devices may be attached to devices such as contact lenses or eyeglasses located very close to the eyes.

In the augmented image implementing methods and apparatuses described above, since the way of directly emitting additional information images formed by using unidirectional beams with no diffusion is used, a control operation of eye lenses to recognize the additional information images are not performed. That is, there is not interference with recognition of real images and the additional. information images and the real images may be recognized together.

It should be understood that example embodiments described herein should be considered in a descriptive sense only and not for purposes of limitation. Descriptions of features or aspects within each example embodiment should typically be considered as available for other similar features or aspects in other example embodiments.

What is claimed is:

1. An image display device comprising:
   a user wearable lens;
   a display panel unit including a plurality of optical elements configured to generate and emit unidirectional lights in an array, the plurality of optical elements being embedded in the user wearable lens or disposed on a surface of the user wearable lens; and
   a control unit configured to control the plurality of optical elements according to image information,
   wherein each of the plurality of optical elements includes,
      a light emitting structure layer configured to generate light, and
      reflectors directly on a top and a bottom of the light emitting structure layer, respectively, the reflectors configured to unidirectionally emit the light generated by the light emitting structure layer.

2. The image display device of claim 1, wherein each of the optical elements comprises one of a laser and a resonant cavity light emitting diode (RCLED).

3. The image display device of claim 1, wherein the plurality of optical elements form a unit pixel, and
   the image display device is configured to form an image by using a spatial combination of lights formed by a plurality of unit pixels, respectively.

4. The image display device of claim 1, wherein the plurality of optical elements form a unit pixel, and
   the image display device is configured to sequentially control an emitting direction of light formed by the unit pixel and the image display device is configured to form an image by the sequential combination of lights heading in different directions.

5. The image display device of claim 4, further comprising:
a variable optical unit having optical characteristics that vary with an external signal, the variable optical unit configured to sequentially change the emitting direction of the light formed by the unit pixel.

6. The image display device of claim 5, wherein the display panel unit is embedded in the lens, and
the variable optical unit is embedded in the lens or is disposed on the surface of the lens.

7. The image display device of claim 4, further comprising:
a driving unit configured to drive positions of the plurality of optical elements.

8. The image display device of claim 1, further comprising:
a direction adjustment unit configured to control a direction of the lights generated and emitted by the plurality of optical elements.

9. The image display device of claim 8, wherein the display panel unit is embedded in the lens, and
the direction adjustment unit is embedded in the lens or is disposed on a surface of the lens.

10. The image display device of claim 1, wherein the display panel unit is disposed in a location in the lens, the location facing a pupil of an eye of the user.

11. The image display device of claim 1, wherein the lens is formed in a pair corresponding to both eyes of the user,
the display panel unit includes a first display panel unit and a second display panel unit corresponding to both eyes, respectively, and
the control unit includes a first control unit configured to control the first display panel unit according to left eye image information and a second control unit configured to control the second display panel unit according to right eye image information.

12. The image display device of claim 1, wherein the control unit is configured to control the display panel unit according to wirelessly received image information.

13. The image display device of claim 1, further comprising:
a light amount control unit having a light transmittance, the light amount control unit configured to control the amount of light from outside.

14. The image display device of claim 13, wherein the light amount control unit includes a liquid crystal.

15. The image display device of claim 1, further comprising:
an energy storage unit configured to store energy to be supplied to the plurality of optical elements, respectively, to generate lights; and a reception circuit unit configured to receive image information from outside,
wherein the energy storage unit and the reception circuit unit are disposed in locations of the lens, excluding a location facing the pupil of the eye of the user.

16. A method of implementing one of augmented reality and virtual reality, comprising:
displaying an additional image bearing additional information about an object in reality by directly emitting the additional image, the additional image formed by using unidirectional beams with no diffusion to a retina of an eye of a user, the additional image being formed by a plurality of optical elements embedded in a user wearable lens or disposed on a surface of the user wearable lens,
wherein the plurality of optical elements are configured to generate and emit unidirectional lights, each of the plurality of optical elements including,
a light emitting structure layer configured to generate light, and
reflectors disposed directly on a top and a bottom of the light emitting structure layer, respectively, the reflectors configured to unidirectionally emit the light generated by the light emitting structure layer.

17. An augmented reality implementing apparatus comprising:
a user wearable lens;
a real image display unit configured to display one of at least one object and an image of the object;
an additional image information generation unit configured to convert information about the object into image information; and
an image display device configured to receive the image information from the additional image information generation unit and form an image, the image display device including a first display panel unit having a plurality of optical elements configured to generate and emit unidirectional lights, the plurality of optical elements is embedded in the user wearable lens or is disposed on a surface of the user wearable lens, and a control unit configured to control the plurality of optical elements according to the image information,
wherein each of the plurality of optical elements includes,
a light emitting structure layer configured to generate light, and
reflectors disposed directly on a top and a bottom of the light emitting structure layer, respectively, the reflectors configured to unidirectionally emit the light generated by the light emitting structure layer.

18. An augmented reality implementing apparatus of claim 17, the image display device is disposed in a location within a distance of 5 cm or less from the eye of the user.

* * * * *